Nov. 17, 1964 A. I. PRESSMAN 3,157,795

TRANSISTOR INVERTER UTILIZING AN IMPEDANCE DIRECTLY CONNECTED BETWEEN BASE AND COLLECTOR TO PREVENT SATURATION

Filed Aug. 16, 1961

INVENTOR.
ABRAHAM I. PRESSMAN

BY John V. Regan

ATTORNEY

United States Patent Office 3,157,795
Patented Nov. 17, 1964

3,157,795

TRANSISTOR INVERTER UTILIZING AN IMPEDANCE DIRECTLY CONNECTED BETWEEN BASE AND COLLECTOR TO PREVENT SATURATION

Abraham I. Pressman, Elkins Park, Pa., assignor to Radio Corporation of America, a corporation of Delaware Filed Aug. 16, 1961, Ser. No. 131,755
12 Claims. (Cl. 307—88.5)

This invention relates in general to circuits suitable for use in digital information handling systems and, more particularly, to improved, high speed amplifier circuits employing transistors.

One type of circuit used extensively in digital information handling systems, digital computers for example, employs diodes for switching and logic functions and transistors for amplification and inversion. Most known prior art circuits of this type are characterized by large signal, or nonlinear, operation in which the transistor is driven between cutoff and saturation in response to one or more applied input pulses. These circuits generally require large signal voltage swings and a large number of different power supply voltages for their operation. Large voltage swings are accompanied by high power dissipation in the various circuit components, and relatively high power loss in driving stray capacitance. Operating the transistor in saturation has the undesirable effects of causing the output pulse width to be different from the input pulse width and reducing the maximum repetition rate of the circuit. For high speed switching applications, storage time occasioned by saturation is undesirable and is to be avoided.

It is an object of the present invention to provide data processing circuits having improved high speed switching characteristics.

It is another object of the invention to provide improved, non-saturating transistor inverter-amplifiers.

It is still another object of the invention to provide improved data processing circuits which operate with small voltage swings and which require a reduced number of different power supply voltages.

These and other objects of the invention are accomplished by connecting a transistor in the common emitter configuration. A unidirectional conducting device is connected between the base electrode and the input to the circuit and poled with its direction of easy current flow opposed to the direction of easy current flow of the emitter-base diode. A resistor is connected between the base and collector electrodes and provides a path for forward, non-saturating base current when the unidirectional device is reverse biased.

One feature of the invention is the novel manner in which the inverting transistor is prevented from saturating.

Another feature of the invention is the manner in which the novel saturation-preventing scheme provides large transient turn-on and turn-off overdrives at the base of the transistor for enhancing high speed operation.

The amplifier circuits according to the invention are inverters, and can therefore be used to construct counters, flip-flops and registers. Output voltage swings are small, thus minimizing the power lost in driving stray capacitance. The inverter-amplifier uses a single transistor for those applications where output loads are local and output capacitance is low. A double transistor version of the circuit can be used for driving remote loads through long, high capacitance, open signal lines or through low impedance terminated transmission lines. The latter circuit is particularly useful when the fan-out is large, that is, when the circuit is required to drive a large number of loads.

In the accompanying drawing, like reference characters refer to like components, and:

Figures 1, 2, 3, 4:
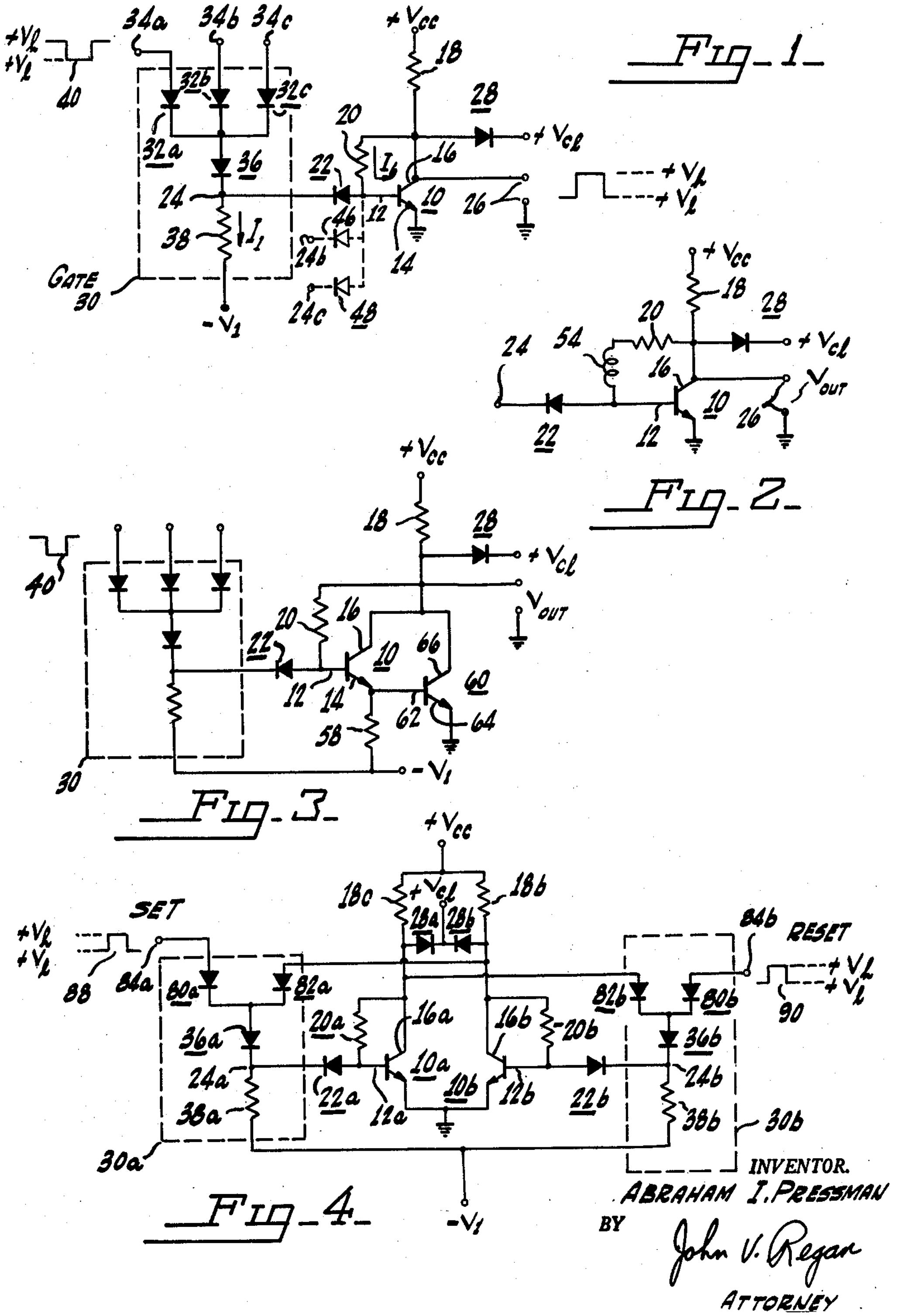
FIGURE 1 is a schematic diagram of an improved data processing circuit according to the invention.
FIGURE 2 is a schematic diagram of a modification to the FIGURE 1 circuit.
FIGURE 3 is a schematic diagram of another embodiment of the FIGURE 1 circuit wherein two transistors are employed to obtain a high beta factor.
FIGURE 4 is a schematic diagram of a flip-flop according to the invention.

FIGURE 1 is a schematic diagram of one form of an improved data processing circuit according to the invention. The circuit comprises an NPN transistor 10 having base 12, emitter 14, and collector 16 electrodes. The transistor 10 is connected in the common emitter configuration by connecting the emitter electrode 14 to a point of reference potential, indicated in the drawing by the conventional symbol for circuit ground, and by connecting the collector electrode 16 to a point of positive potential, designated $+V_{cc}$, by way of a collector load resistor 18. The bias source $V_{cc}$ may be, for example, a battery having its positive terminal connected to the upper end of the resistor 18 and having its negative terminal connected to circuit ground. A resistor 20 is connected between the collector electrode 16 and the base electrode 12. A diode 22, or other unidirecitonal conducting device, has its anode connected to the base electrode 12 and its cathode connected to a common junction point 24. The diode 22 is poled with its easy current flow direction opposing the easy current flow direction of the emitter-base diode of the transistor 10. That is, the diode 22 and the transistor emitter-to-base diode are in back-to-back relation with respect to each other. Accordingly, current passed by the diode 22 is in the direction of reverse base current.

The output of the transistor 10 circuit is derived at a pair of output terminals 26, one of which is connected directly to the collector electrode 16. The other of the output terminals 26 is connected to ground. The voltage at the collector electrode 16 in one operating state of the circuit may be clamped at a predetermined value by connecting a clamp diode 28 between the collector 16 and a source of positive clamp potential, designated $+V_{cl}$. In some cases to be described, it is preferable to eliminate the clamp circuit.

An input circuit for supplying signals selectively to the transistor circuit has its output connected at the common junction 24. The input circuit, which may assume various forms, is illustrated by way of example as being a diode gate 30 comprising three input diodes 32*a* . . . 32*c*. The particular number of input diodes is by way of illustration, and it will be understood that more or fewer diodes may be used, depending upon the particular application. The anode of each of the diodes 32*a* . . . 32*c* is connected to a different input terminal 34*a* . . . 34*c*, respectively. The cathodes of the input diodes 32*a* . . . 32*c* are connected together and to the anode of the isolating diode 36. The input diodes 32*a* . . . 32*c* preferably are germanium diodes and the isolating diode 36 preferably is a silicon diode, for reasons which will be apparent as the description proceeds. The cathode of the isolating diode 36 is connected to the common junction 24 and, by way of a resistor 38, to a source of negative biasing potential, designated $-V_1$. The biasing source may be, for example, a battery (not shown) having its negative terminal connected to the lower end of the resistor 38 and having its positive terminal grounded.

The gate 30 may be considered either as a positive "or" gate or as a negative "and" gate, depending upon whether the pulses applied at the input terminals 34*a* . . . 34*c* are positive going or negative going, respectively. For example, assume that the voltage level at any one of the input terminals normally is high, or $+V_h$ volts. Current in the conventional sense, flows from that one input terminal 34*a* . . . 34*c* through the respective one of the input diodes 32*a* . . . 32*c*, then through the diode 36, and resistor 38 to the bias source $-V_1$. The output voltage at the common junction 24 then is high, relatively speaking, and is equal approximately to $+V_h$ volts less the combined forward voltage drops across the isolating diode 36 and the one of the input diodes 32*a* . . . 32*c*. The output voltage at the common junction 24 remains at this high value so long as any of the input terminals 34*a* . . . 34*c* receives a voltage of $+V_h$ volts, and drops to a lower value only when all of the inputs drop to $+V_l$ volts. In this sense then the gate 30 may be considered a negative "and" gate, that is, a gate whose output changes from a first, high level to a second, lower level only when all of the inputs are changed from a first, high level to a second lower level, for example by applying negative-going pulses 40 at all input terminals 34*a* . . . 34*c*.

The gate 30 also is capable of performing the logical "or" function for positive-going input pulses, as follows. Assume that all of the inputs normally are low, $+V_l$ volts. The gate 30 then is "closed," and output at the common junction is low, relatively speaking. However, when the input voltage at any one or more of the input terminals 34*a* . . . 34*c* is raised to $+V_h$ volts, the gate 30 is opened and the output voltage at the common junction 24 rises to a high value, relatively speaking. This operation will be recognized as that of an inclusive "or" gate.

The combination of the resistor 38 and the bias source $-V_1$ functions as a current source. The diode gate 30 operates to steer this current into the diode 22 in the base 12 circuit or to shunt this current away from the diode 22 and through one or more of the input diodes 32*a* . . . 32*c*. The voltage levels and component values employed in the gate 30 are selected so that the voltage at the common junction 24 has a high enough positive potential to reverse bias the diode 22 when the voltage at any of the input terminals 34*a* . . . 34*c* is at $+V_h$ volts.

Consider now the operation of the FIGURE 1 circuit when any input at 34*a*, 34*b* or 34*c* goes high. The point 24 goes high and the diode 22 is reverse biased. The base electrode 12 of the transistor 10 is connected to the positive bias potential $+V_{cc}$ by way of the resistors 18 and 20. Accordingly, the base 12 is forward biased with respect to the emitter 14 and a current $I_b$, in the conventional sense, flows from the $+V_{cc}$ source through the resistors 18 and 20 into the base 12, turning the transistor 10 on. The collector current is $\beta I_b$, where $\beta$ is the beta of the transistor. Inasmuch as the base current is supplied through the resistor 20, the collector 16 voltage always is more positive than the base 12 voltage by an amount equal to the IR drop across the resistor 20. Therefore, the transistor 10 cannot saturate and storage delay is negligible for practical purposes.

The output voltage at the collector 16 electrode is given by the expression:

$$V_{out}=V_{be}+I_bR_{20} \quad (1)$$

where $V_{be}$ is the forward voltage drop across the emitter-base diode and $R_{20}$ is the resistance of the resistor 20. Under no load condition, which is the normal condition when the transistor 10 is full "on" and the output voltage is at its lowest value, the output voltage is also given by the expression:

$$V_{out}=V_{cc}-I_b(1+\beta)R_{18} \quad (2)$$

where $R_{18}$ is the resistance of the collector bias resistor 18. From Equations 1 and 2 it may be seen that the higher the beta, the lower the output voltage and base current $I_b$ for a given value of the resistor 20. In the design of a particular circuit, the value of the resistor 20 is selected in accordance with the beta of the transistor to give desired collector 16 output voltage and minimum power dissipation in the transistor 10. When making a "worst case" design for a standard circuit, however, it generally is necessary to make a compromise in the value of this resistor 20 to accommodate transistors which vary in the value of beta. The output voltage in the "on" state of the transistor 10 is equal, for practical purposes, to $+V_l$ volts, the low voltage level input to the diode gate 30.

The output voltage at the collector 16, in the "on" condition of the transistor 10, may vary slightly with any change in transistor 10 loading. Changes in loading are compensated for by a change in the base 12 and collector 16 current so that the base 12 current $I_b$ has the proper value to supply the needed collector current. The same holds true when a transistor of different beta is substituted in the circuit. However, the collector-base diode always is reverse biased because of the base current flowing through the resistor 20, and the transistor 10 thereby is prevented from saturating in the full "on" condition.

Consider now the operation of the circuit when negative-going pulses 40 are applied at all of the input terminals 34*a* . . . 34*c*. The voltage at the common junction 24 decreases to a value at which the diode 22 becomes forward biased. The silicon diode 36, because of its large forward voltage drop (say 0.6 volt or so), effectively isolates the input diodes 32*a* . . . 32*c* from the junction 24 when the diode 22 conducts, whereby all of the current $I_1$ flowing through the resistor 38 in the current source is supplied via the diode 22. The current $I_b<I_1$ originally supplied through the resistor 20 to the base 12 then is diverted to the diode 22. The voltage at the collector electrode 16 cannot change instantaneously because of transistor 10 conduction, and the additional current $I_1-I_b$ demanded by the input circuit initially is taken from the base 12 as reverse base current. This action results in a hard overdrive transient at the base 12 and aids in fast turn off of the transistor 10.

The voltage at the collector 16 rises in a positive direction as the transistor 10 turns off. As the collector 16 voltage rises, more of the input current is supplied through the resistors 18 and 20 and less is supplied by the transistor 10. All of the input current flows through the resistor 20 in the steady state condition of the circuit. The clamp diode 28 conducts when the collector 16 potential rises above $+V_{cl}$ volts, and clamps the collector voltage at that value. The upper level collector 16 voltage can be clamped at a desired value with the transistor 10 cut off by a proper selection of the values of the resistor 38 and the bias source $-V_1$. For a given clamp voltage, for example, these values are selected so that the voltage at the base 12 is negative relative to the emitter 14 voltage. Preferably, the collector 16 voltage is clamped at $+V_h$ volts, the upper level of the input to the gate 30. The inputs to, and the outputs from, the FIGURE 1 circuit then are compatible. The load at the output terminal 26 may be, for example, another gate similar to the gate 30.

In certain cases, depending upon the input voltage levels, the voltage at the junction 24 may fall far enough negative to forward bias the silicon diode 36 and input diodes 32*a* . . . 32*c* after the base 12 voltage goes negative. A portion of the constant current then is shunted through the gate 30. However, this condition, if present, can occur only after the overdrive transient and thus does not affect the high speed turn-off. The condition can be prevented by connecting another isolating diode in series with the diode 36 to increase the threshold of the gate 30.

It is not necessary to completely cut off the transistor 10 to obtain the desired output voltage change. This is done only to reduce transistor 10 dissipation. Faster transistor turn-on (reduced turn on-wait delay) can be achieved if the transistor 10 is not completely cut off in the "off" state. This condition can be realized by selecting the resistor 38 and bias source $-V_1$ values so that the quantity $+V_{cl}$ less the IR drop across resistor 20 is slightly positive with respect to ground. The emitter-base diode then is forward biased a small amount and the transistor 10 is biased in the active region in the "off" state of the circuit. Alternatively, the transistor 10 can be made to conduct at a higher collector 16 potential by eliminating the clamp diode 28 and clamp source $+V_{cl}$. When the latter is done, the current from resistor 18 flows into collector 16 which is at a higher potential than when transistor 10 is "on."

A further important advantage of the FIGURE 1 circuit is fast turn-on. The current flowing through the resistor 20 in the "off" condition of the transistor circuit is many times the base current $I_b$ flowing through this resistor 20 when the transistor 10 is fully on. A positive voltage level $+V_h$ applied at any of the input terminals *34a . . . 34c* opens the gate 30 and causes the voltage at the common junction 24 to rise sufficiently to reverse bias the diode 22. The large current flowing through the resistor 20 then is diverted into the base 12 of the transistor 10 and remains high as long as the collector 16 voltage is relatively high. Thus the forward overdrive is high during the initial turn-on transient, whereby fast turn-on is achieved. This overdrive decreases as the collector 16 voltage decreases due to transistor 10 conduction, and reaches a steady value at which the base current $I_b$ is just sufficient to supply the required, steady state collector 16 current.

The FIGURE 1 circuit, as it has been discussed so far, includes one level of diode logic followed by a non-saturating inverter-amplifier. However, the diode 22 at the base 12 input may itself be a component part of a second diode logic gate. Other diodes such as the diodes 46 and 48 may be connected between the base electrode 12 and the terminals **24*b* and 24*c*. The latter terminals may be connected to the outputs of other gates such as the gate 30 of FIGURE 1. The diodes 22, 46, 48 function as a negative "or" gate when the input gates 30 function as a negative "and" gate, or as a positive "and" gate when the input gates 30** function as positive "or" gates.

It should be emphasized that the large transient turn-on and turn-off overdrives are achieved in the FIGURE 1 circuit without the need for especially shaped input pulses. Moreover, the circuit is not repetition rate sensitive nor does it suffer from high transient dissipation problems because it requires no reactive elements in the input circuit to achieve its high operating speed.

The circuit has the advantage over conventional diode feedback schemes used to prevent saturation in that it does not suffer from diode recovery time effects at high frequencies.

By way of example, an amplifier which was constructed according to FIGURE 1 and operated successfully had the following circuit values:

| | | |
|---|---|---|
| Resistor **18** | ohms | 470 |
| Resistor **20** | do | 510 |
| Resistor **38** | do | 2700 |
| $V_1$ | volts | 15 |
| $V_2$ | do | 20 |
| $V_h$ | do | 2.5 |
| $V_l$ | do | 0.8 |
| Transistor **10** | | RCA 2N955 |

The turn-on and turn-off times of the transistor circuit can be reduced further by connecting an inductor 54 in series with the resistor 20, as illustrated in FIGURE 2. The current through an inductor cannot change instantaneously. Accordingly, the inductor 54 has the effect of increasing the effective duration of the overdrive transient during turn-on and turn-off. A large current, relatively speaking, flows through the resistor 20, the inductor 54 and the diode 22 to the input terminal 24 when the transistor 10 is in the "off" state. When the diode 22 is reverse biased in response to a rise in voltage at the junction 24, this large current is diverted to the base 12, as described previously, to provide an overdrive turn-on of the transistor 10. This overdrive current is supplied for a longer period of time because of the action of the inductor 54, and does not decrease even as the collector 16 voltage begins to fall from its high positive value. The high initial base current thus persists for a longer time in the FIGURE 2 circuit and speeds up the turn-on time.

Similarly, at the beginning of the turn-off period, the presence of the inductor 54 results in a large initial reverse base current for a longer time and thus provides faster turn-off. A large current must be supplied through the diode 22 to the common junction 24 when the diode 22 becomes forward biased. This current, as described previously, is many time the normal base 12 current supplied through the resistor 20. A current equal to the difference between these current values is supplied by the transistor 10 as reverse base current. This high reverse base current is kept flowing for a longer period of time in the FIGURE 2 circuit by the action of the inductor 54, even as the collector 16 voltage begins to rise in a positive direction. The overdrive turn-off transient is thus effective for a longer period of time and results in faster turn-off of the transistor 10.

Only a portion of the FIGURE 1 circuit is illustrated in FIGURE 2. It will be understood, however, that a suitable input circuit such as the diode gate 30 has its output terminal connected at the junction 24. Operation of the FIGURE 2 circuit is similar to that of the FIGURE 1 circuit, except for the differences noted above.

One of the difficulties in the "worst case" design of the FIGURE 1 circuit is that the "on" collector 16 potential is sensitive to the beta of the transistor and to the collector 16 "on" current. If the beta is very large the collector 16 "on" potential is substantially independent of beta and is approximately equal to the difference in voltage between the base 12 and emitter 14. This follows from the fact that if beta is large enough, only a very small base current flows through the resistor 20. The circuit of FIGURE 1 may be made substantially independent of beta by connecting a second transistor 60 across the transistor 10, as illustrated in FIGURE 3. In FIGURE 3, the emitter 14 of the transistor 10 is connected through a resistor 58 to the biasing source $-V_1$, and also is connected directly to the base electrode 62 of the transistor 60. The emitter electrode 64 of transistor 60 is grounded, and the collector electrode 66 is connected directly to the collector electrode 16 of the transistor 10. The circuit is otherwise the same as the FIGURE 1 circuit.

Connecting two transistors in the manner illustrated in FIGURE 3 has the effect, among others, of greatly increasing the beta of the combination to a value which is much greater than the beta of either transistor alone, it being equal approximately to the product of the individual betas. The transistor 10 is kept out of saturation in exactly the same manner as described previously in connection with the FIGURE 1 circuit and, accordingly, the collector 16 voltage always is positive with respect to the base 12 and emitter 14 voltages. The transistor 60 then cannot saturate because its base 62 is connected to the emitter 14 of the transistor 10 and always is less positive in potential than the collector 66.

The FIGURE 3 circuit has the same advantages as the FIGURE 1 circuit. It has the further advantage that the "on" collector potential is substantially independent of the betas of the transistors 10, 60. This circuit is especially well suited for driving remote loads through long, high capacitance, open signal means or through low impedance, terminated transmission lines because of its high current handling capacity. The FIGURE 3 circuit also is capable of driving a greater number of output loads than the single transistor version of FIGURE 1.

FIGURE 4 is a schematic diagram of a flip-flop, or bistable multivibrator, according to the invention. The flip-flop comprises two cross-coupled circuits of the type illustrated in FIGURE 1 and described previously. The gate 30*a* at the input to the left half of the flip-flop, as viewed in the drawing, comprises first and second input diodes 80*a*, 82*a*, and functions as a positive "or" gate. That is to say, the gate 30*a* is opened and the current from the current source comprising resistor 38*a* and bias source $-V_1$ flows through the isolating diode 36*a* to one of the input diodes 80*a*, 82*a* when the voltage at the anode of that diode 80*a*, 82*a* is high. The anode of the diode 80*a* is connected to an input terminal 84*a* which receives positive-going pulses 88 whenever it is desired to set the flip-flop. The anode of the other diode 82*a* is directly connected to the collector 16*b* of the transistor 10*b* in the other half of the flip-flop. The diode gate 30*b* at the input to the right-hand half of the flip-flop is similar to the gate 30*a*. The diode 82*b* in the gate 30*b* is directly connected to the collector electrode 16*a* of the transistor 10*a*. The anode of the diode 80*b* is connected to an input terminal 84*b*, which receives positive-going pulses 90 whenever it is desired to reset the flip-flop. The flip-flop may be considered to be in the "set" state whenever the transistor 10*a* is fully "on" and the transistor 10*b* is "off." The states of the transistors 10*a* and 10*b* are reversed when the flip-flop is in the "reset" state.

Consider now the operation of the flip-flop and assume that the flip-flop is reset, that is, the transistor 10*b* is "on." The "disconnect" diode 22*b* is reverse biased, as will be seen hereinafter. Current flows from the $+V_{cc}$ source through the resistors 18*b* and 20*b* to the base 12*b* and keeps the transistor 10*b* "on" in a non-saturated condition. The voltage at the collector electrode 16*b* is at its lowest level, approximately $+V_1$ volts. This voltage is applied at the anode of the diode 82*a* in the gate 30*a*. The input at the input terminal 84*a* also is low at this time, whereby the voltage at the junction 24*a* is sufficiently low to forward bias the disconnect diode 22*a*. Accordingly, a large current flows through the resistor 20*a* and the disconnect diode 22*a* to the junction 24*a* and biases the transistor 10*a* in the "off" state. The collector 16*a* voltage is at its high level. This voltage, applied at the anode of the diode 82*b*, results in a high voltage, relatively speaking, at the junction 24*b*, whereby the disconnect diode 22*b* in the base circuit of the transistor 10*b* is reverse biased.

The flip-flop remains in the state described above until a positive pulse 88 is applied at the input terminal 84*a* of the gate 30*a*. This pulse 88 causes the voltage at the junction 24*a* to rise to a value sufficient to reverse bias the disconnect diode 22*a*. The transistor 10*a* then conducts, and the collector 16*a* voltage falls to its lower level of $+V_1$ volts. Both inputs to the gate 32*b* then are low, the voltage at the junction 24*b* drops low enough in value to forward bias the disconnect diode 22*b*, and the transistor 10*b* turns "off." The voltage at the collector 16*b* rises to its upper value when the transistor 10*b* turns off and keeps the gate 30*a* open at the termination at set pulse 88. The flip-flop is now in the "set" state and remains in the set state until the next positive reset pulse 90 is applied at the input terminal 84*b*.

The flip-flop circuit has the same advantages as the FIGURE 1 circuit. The operating speed of the flip-flop circuit is higher than most known flip-flops because the transistors 10*a* and 10*b* are prevented from saturating. Turn-on and turn-off times also are faster than in known circuits because of the large overdrive transient during initial turn-on and turn-off. Turn-on and turn-off times may be reduced further by connecting inductors (not shown) in series with the resistors 20*a*, 20*b* in the manner illustrated in FIGURE 2.

Each of the circuits of FIGURES 1–4 is illustrated as comprising NPN transistors, and have been so described. It should be understood, however, that the invention is not limited to the use of NPN transistors. PNP transistors may be substituted in these circuits, provided that the connections to all of the diodes are reversed and provided further that the polarities of the various bias sources and input pulses are reversed.

What is claimed is:

1. A circuit comprising: a transistor having a base, an emitter and a collector; an impedance element connected at one end to said collector; means for applying operating potentials to the other end of said impedance element and to said emitter; a resistor and an inductor serially connected directly between said collector and said base; a unidirectional conducting device having one electrode connected to said base and being poled with its easy current flow direction in opposition to the easy current flow direction of the emitter-base diode of said transistor; and means for varying the potential at the other electrode of said device between a first level and a second level for forward biasing and reverse biasing said device, respectively.

2. A circuit comprising: a transistor having a base, an emitter and a collector; an impedance element connected at one end to said collector; means for applying operating potentials to the other end of said impedance element and to said emitter; a clamp diode having one electrode connected to said collector; means for applying a clamp voltage to the other electrode of said clamp diode; a resistor connected between said collector and said base to conduct forward base current supplied entirely by way of said impedance element; a unidirectional conducting device having one electrode connected to said base and being poled with its easy current flow direction in opposition to the easy current flow direction of the emitter-base diode of said transistor; and means for varying the potential at the other electrode of said device between a first level and a second level for forward biasing and reverse biasing said device, respectively.

3. The circuit as claimed in claim 2 wherein said clamp diode is poled with its direction of easy current flow in the same direction, with respect to said collector, as the direction of reverse collector current.

4. A circuit comprising: a transistor having a base, an emitter and a collector defining an emitter-base diode and a collector-base diode; an impedance element connected at one end to said collector; means for applying an operating potential to the other end of said impedance element; a resistor connected solely in a path between said collector and said base; a disconnect diode having one electrode connected to said base and being poled with its easy current flow direction opposing the easy current flow direction of said emitter-base diode; a diode gate including two or more diodes each having one like electrode connected together; an isolating diode having one electrode connected to each said like electrode; a current source connected to the other electrode of said isolating diode and to the other electrode of said disconnect diode; and means for selectively opening and closing said gate to steer the current from said current source into and away from said disconnect diode, respectively.

5. A circuit comprising: a transistor having a base, an emitter and a collector defining an emitter-base diode and a collector-base diode; an element of impedance connected at one end to said collector; means for applying operating potentials to said emitter and to the other end of said impedance element; the combination of a first resistor and an inductor serially connected directly between said collector and said base; an input diode having one terminal connected to said base and being poled with its easy current flow direction in opposition to the easy current flow direction of said emitter-base diode; a second resistor having one end connected to the other terminal of said input diode; means for connecting a source of voltage between the other end of said resistor and said emitter for normally forward biasing said input diode; and means for selectively changing the voltage at said one end of said second resistor to reverse bias said input diode.

6. The combination as claimed in claim 5 including means for clamping the voltage at said collector when said input diode is biased in the forward direction.

7. The combination comprising: a first transistor of one conductivity type having a collector, a base and an emitter; a first impedance element having one terminal connected to said collector, a second impedance element having one terminal connected to said emitter; means for applying operating potentials to the other terminals of said first and second impedance elements; a resistor connected between said collector and said base and providing a path for forward base current supplied through said first impedance element; a diode having one electrode connected to said base and being poled in back-to-back relation to the emitter-base diode of said transistor; means for varying the potential at the other electrode of said diode between a first level and a second level for forward biasing and reverse biasing said diode; a second transistor of the same said one conductivity type having a base, a collector and an emitter; and means for connecting the emitter and collector of said first transistor to said base and said collector of said second transistor, respectively.

8. The combination comprising: a first transistor of one conductivity type having a collector, a base and an emitter; a first impedance element having one terminal connected to said collector, a second impedance element having one terminal connected to said emitter; means for applying operating potentials to the other terminals of said first and second impedance elements; a resistor and an inductor serially connected between said collector and said base and providing the sole path for forward base current supplied in its entirety through said first impedance element; a diode having one electrode connected to said base and being poled in back-to-back relation to the emitter-base diode of said transistor; means for varying the potential at the other electrode of said diode between a first level and a second level for forward biasing and reverse biasing said diode; a second transistor of the same said one conductivity type having a base, a collector and an emitter; and means for connecting the emitter and collector of said first transistor to said base and said collector of said second transistor, respectively.

9. A flip-flop comprising: a first circuit portion including a first transistor having a base, an emitter and a collector; an element of impedance having one terminal connected to said collector; a first resistor connected by negligible resistance means between said base and said collector; a second resistor and a unidirectional conducting device connected, in the order named, between a common junction and said base, said unidirectional device being poled with its easy current flow direction in opposition to the easy current flow direction of the emitter-base diode; a second circuit portion similar to said first circuit portion; means for applying a first operating potential between said common junction and the emitter electrodes of both of the transistors, said operating potential having a magnitude and polarity tending to normally forward bias each of the unidirectional conducting devices; means for applying a second operating potential between said emitters and the other terminals of each of the impedance elements; and a pair of cross-coupled networks, each including at least a diode connected between the collector of a different transistor and the junction between the second resistor and the unidirectional conducting device associated with the other transistor, each said diode being poled with its easy current flow direction in opposition to the easy current flow direction of the associated said unidirectional conducting device.

10. The flip-flop as claimed in claim 9 including a pair of clamping diodes each having one terminal connected to a different collector electrode, and means for applying a bias voltage to each other terminal of the clamping diodes.

11. A flip-flop comprising: a first circuit portion including a first transistor having a base, an emitter and a collector; an element of impedance having one terminal connected to said collector; a first resistor connected between said base and said collector and providing a path for forward base current supplied by way of said element of impedance; a second resistor and a disconnect diode connected, in the order named, between a common junction and said base, said disconnect diode being poled with its easy current flow direction in opposition to the easy current flow direction of the emitter-base diode; a second circuit portion similar to said first circuit portion; means for applying a first operating potential between said common junction and the emitter electrodes of both of the transistors, said operating potential having a magnitude and polarity tending to normally forward bias each of the disconnect diodes; means for applying a second operating potential between said emitters and the other terminals of each of the impedance elements; a pair of cross-coupling networks each comprising second and third diodes connected in series and poled in the same direction, between the collector of a different transistor and the junction between the second resistor and the disconnect diode at the base of the other transistor; means for applying a first input pulse at the junction of the second and third diodes in one of said cross-coupling networks for setting the flip-flop; and means for applying a second input pulse at the junction between the second and third diodes of the other of said cross-coupling networks for resetting the flip-flop.

12. The flip-flop as claimed in claim 11 wherein each of said first and second pulses is applied to the junction of the respective second and third diodes by way of another diode.

References Cited in the file of this patent

UNITED STATES PATENTS

| | | |
|---|---|---|
| 2,884,544 | Warnock | Apr. 28, 1959 |
| 2,947,880 | Anderson | Aug. 2, 1960 |
| 2,949,543 | Nordahl et al. | Aug. 19, 1960 |

References Cited by the Applicant

UNITED STATES PATENTS 3,043,966 1/62 Norman.